United States Patent [19]

Qui

[11] Patent Number: 5,361,037
[45] Date of Patent: Nov. 1, 1994

[54] ISOLATION AMPLIFIER WITH CAPACITIVE COUPLING

[76] Inventor: Xueuing Qui, c/o Paul Chiu 172-06 73rd Ave., Flushing, N.Y. 11366

[21] Appl. No.: 65,480

[22] Filed: May 24, 1993

[30] Foreign Application Priority Data

May 16, 1992 [CN] China ................................ 92104282

[51] Int. Cl.$^5$ ............................................. H03F 1/14
[52] U.S. Cl. ............................................. 330/9; 330/51
[58] Field of Search ...................... 330/9, 51, 107; 307/491

[56] References Cited

U.S. PATENT DOCUMENTS

| 4,354,169 | 10/1982 | Nossek | 330/107 |
| 4,555,668 | 11/1985 | Gregorian | 330/107 |
| 4,580,103 | 4/1986 | Tompsett | 330/51 |
| 5,116,481 | 5/1992 | Ozawa | 204/290 R |
| 5,136,255 | 8/1992 | Fattaruso | 330/296 |
| 5,187,390 | 2/1993 | Scott | 307/353 |

FOREIGN PATENT DOCUMENTS

| 3250911 | 11/1991 | Japan | 307/491 |
| 8303326 | 9/1983 | WIPO | 330/9 |

Primary Examiner—Steven Mottola
Assistant Examiner—Tiep H. Nguyen
Attorney, Agent, or Firm—Richard L. Miller

[57] ABSTRACT

An isolation linear amplifier circuit provides and utilizes coupling of switched-capacitors. An input differential signal is converted to a proportionated charge on the capacitor by gates controlling of charging and discharging of appropriate capacitors. Then the charge is detected by a differential amplifier with high input resistance. The isolation barrier is established by a configuration of capacitors and an array of gating switches.

4 Claims, 2 Drawing Sheets

ISOLATION AMPLIFIER WITH CAPACITIVE COUPLING

BACKGROUND OF THE INVENTION

The instant invention is the subject matter of Disclosure Document No.: 313364, filed in the PTO on Jul. 20, 1992, and it is respectfully requested that this document be retained beyond the two-year period so that it may be relied upon as evidence of conception of the invention during the prosecution phase of this application, should the need arise.

1. Field of the Invention

This invention relates to amplifier with periodically disabling switch and specially to isolation amplifier.

2. Description of the Prior Art

Generally speaking, capacitors and transformers are usually utilized in alternating current (A.C.) signal coupling. For isolation transfer of differential voltages which include typically, D.C. and low frequency components, the existing arts all apply to modulation-demodulation techniques. At first, the voltage is converted to a high frequency signal through a modulator. This high frequency signal can then be isolatedly transferred by means of capacitor or transformer coupling. After that, the modulated high frequency signal is recovered via a demodulator back to an analog signal that proportionally follows the source voltage. In this manner, the capacitor or transformer plays important roles of both isolation and coupling. It must be noted that some optical devices can play the same role in some applications such as optical coupled isolation amplifiers. In reality, it is also a type of modulation-demodulation system.

Among both of these type reactance elements, the transformer is mostly preferred as a key part of an isolation amplifier, and there are numerous U.S. patents that are examples of such.

In a few applications, instead of transformers, capacitors are utilized, for example, U.S. Pat. Nos. 4,292,595 issued to Lewis R. Smith and 4,748,419 to Thomas A. Somerville. The main advantage and reason for utilizing the capacitor instead of the transformer is that the capacitor performs an integrating process while the transformer can not.

There are some shortcomings that these modulation-demodulation techniques suffer, typically as follows:

1) Nonlinear distortions are often present with these modulation or demodulation processes. Accordingly, this causes degradation of accuracy and dynamic range;

2) The band width of response may be limited at least by carrier frequency; and

3) Circuit design is unduly complex.

A so-called "flying capacitor" technique is in fact a pulse amplitude modulation method. The coupling parts of which consists of a capacitor for data storage and a double pole double throw (DPDT) switch used to generate a data carrier and form a circuit which simultaneously provides isolation between input and output terminals. The DPDT switch alternately connects the capacitor to the inputs for sampling and the outputs for detecting. This kind of arrangement of components is the same as sample-and-hold circuits. The isolation between inputs and outputs is realized by moving contacts of the DPDT switch. Unfortunately, among all kind of DPDT switches, only the mechanical relays can be utilized as high level isolation devices. However, they suffer for some shortcomings such as: the requirement of relative large drive power, low speed, bulkiness and poor reliability.

Accordingly switched-capacitors are devices which perform the function of both storing and transferring charge and are widely applied in high performance differential amplifier and digital converter. Typically, a delta-sigma techniques and an auto-zero techniques have been developed for the promotion of accuracy and stability and improvement of zero shift of amplifiers. A description of the techniques is shown in, for example, the article: "Low-Level MOS Transistor Amplifier using Storage Techniques", R. Poujois, B. Baylac, D. Barbier and J. M. Ittel, Digest of Tech. Papers IEEE Int. Solid-State Circuits Conf., pp. 152–153 Feb. 1973. Yet none of these techniques have used the switched capacitor as a key part to accomplish both coupling and high level isolation while transferring charge.

This invention applies gating storage techniques with capacitors to realize high level isolation sensing of differential voltage and to overcome all shortcomings mentioned above.

SUMMARY OF THE INVENTION

Accordingly, a first object of the invention is to provide a capacitive coupling circuit that can amplify differential voltage precisely without causing non-linear effect produced by modulation-demodulation components.

Yet, the second object of the invention is to provide a capacitive coupling circuit wherein the capacitance of coupling capacitors can be designed so small, typically in the range of 10 picofarads or less, that high level isolation barrier can be easily achieved.

Additionally, the third object of the invention is to provide a configuration of circuitry design with low cost and high quality for isolation amplifier or interconnection networks between two isolated circuits. The circuit of the invention principal consists of a voltage-to-charge converter and a differential amplifier as a charge detector. The voltage-to-charge converter includes a capacitive divider and two discharging switches with a driving clock function. There are three capacitors connected in series in the capacitive divider. Input differential voltage applies upon the divider. Two plates of the middle capacitor in the divider are the charge output nodes of the converter. Two discharging switches are connected in parallel respectively with inputs of said divider and outputs of said converter. Both of the switches are driven simultaneously by the clock function. When switches are turned on, the capacitive divider is in discharging state and the charges induced by input differential voltage are cleared out. Of course, some additional parts are necessary for protecting input voltage from short circuit. This process is called "reset". When both the switches are turned off, the input differential voltage charges the divider again which makes the charges on the middle capacitor change with it and be tested by a following linear amplifier with a very high input resistance. This process is called "refollow". If the time period of "reset" is much smaller than that of "refollow", the output current of the linear amplifier would be made to closely enough follow with input differential voltage proportionally. Therefore, it concludes a working arrangement of "reset-and-refollow" which is quite different from the well-known of "sample-and-hold".

The isolation barrier consists of two parts in parallel. One part is constituted by those two capacitors except the middle one in capacitive divider, the other part is between contacts and driving circuit of the switches. This kind of switch is practical.

BRIEF DESCRIPTION OF THE DRAWING FIGURES

The figures in the drawings are briefly described as follows.

Wave Shape AA is a clock function CK.

Wave Shape BB is a waveform sample of input differential voltage on nodes 11 and 12.

Wave Shape CC is the waveform response to Wave Shape BB on nodes 31 and 32.

Figure 3:
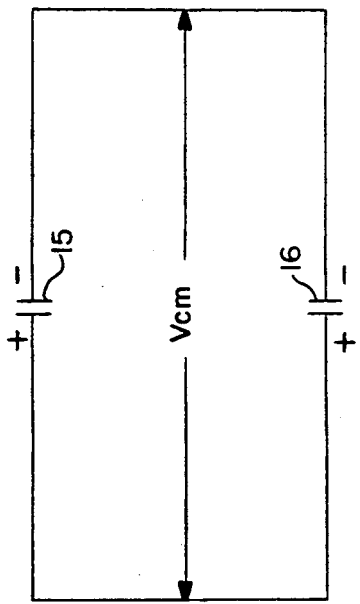

FIG. 3 shows charge distribution in the capacitive divider induced by common mode voltage during set phase of clock function CK.

Figure 4A:
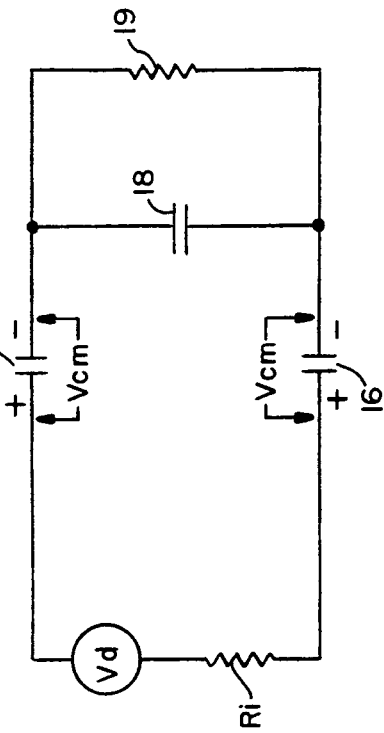

FIG. 4a shows charge distribution in the capacitive divider at the beginning of reset phase of clock function CK.

Figure 4B:
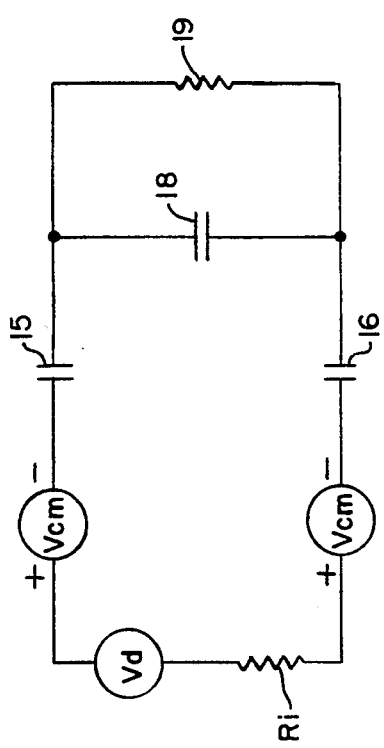

FIG. 4b indicates equivalent circuit of FIG. 4a.

Figure 4C:
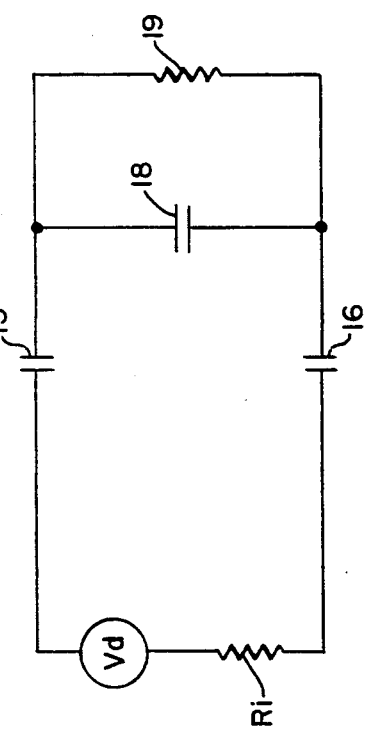

FIG. 4c indicates equivalent circuit of FIG. 4b.

Figure 1:
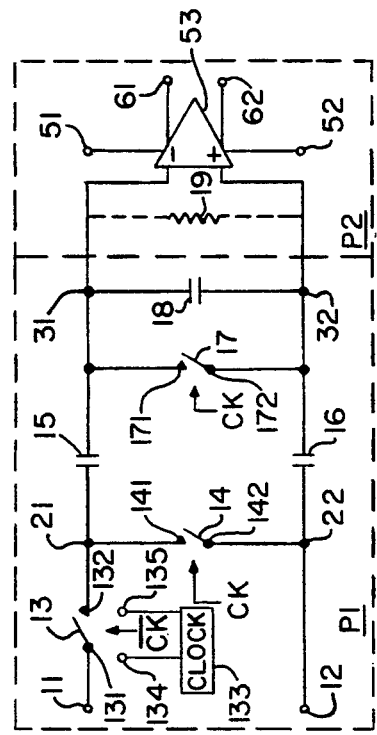
FIG. 1 shows a basic scheme for present invention.
Figure 5A:
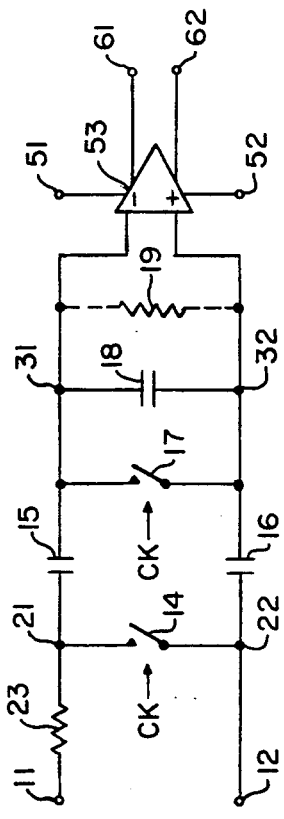

FIG. 5a indicates a simplified scheme of FIG. 1.

Figure 5B:
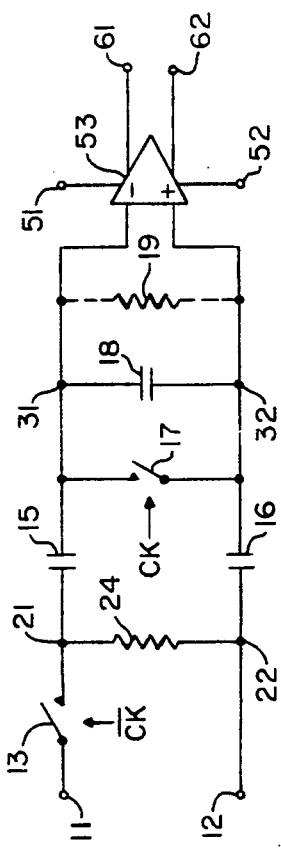

FIG. 5b indicates another simplified scheme of FIG. 1.

Figure 6:
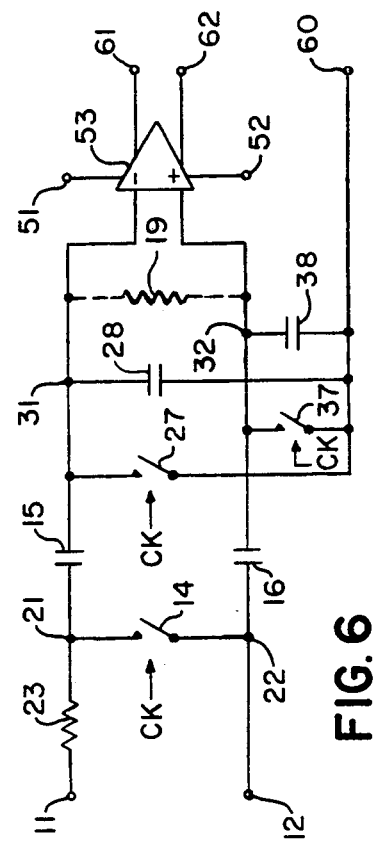

FIG. 6 discloses a practical scheme for isolation amplifier.

DESCRIPTION OF THE INVENTION

Turning now descriptively to the drawings, in which similar reference characters denot similar elements throughout the several views, FIG. 1 shows the principle scheme of the invention. The circuit basically consists of two parts. Part P1 shows the voltage-to-charge converter with isolation, and part P2 shows the differential amplifier with a very high input resistance and a current gain of much larger than one as a charge detector. Nodes 31 and 32 interconnect two parts. Part P1 further consists of a capacitive divider and some switches. The capacitive divider includes three capacitors named first and second coupling capacitors 15 and 16 respectively and output capacitor 18 that is connected in series in the middle of said divider. Nodes 11 and 12 are first input and second input where the source input differential voltage comes from. Each of the capacitors 15 and 16 has first plate and second plate. Accordingly the junction of the capacitor 18 and second plate of capacitor 15 is connected to node 31 as first charge output, while the junction of capacitor 18 and second plate of 16 is connected to node 32 as second charge output. A first switch 14 named coupling reset switch is connected to first plate of first coupling capacitor 15 at node 21 with its one contact 141 and to first plate of second coupling capacitor 16 at node 22 with its other contact 142. A second switch 17 named output reset switch is connected in parallel with capacitor 18. Another switch which has two contacts 171 and 172 13 named protection switch is connected in series between first input 11 and node 21 with its contacts 131 and 132, respectively, while second input 12 and node 22 are connected together. Part P2 consists of a differential amplifier 53 with an equivalent input resistor 19. The amplifier 53 has negative and positive inputs connected to nodes 31 and 32 respectively, where the output charge of the part P1 is created resistor 19 is also connected to. Nodes 61 and 62 are first and second outputs of the amplifier 53 and nodes 51 and 52 are its power supply terminals.

Figure 2:
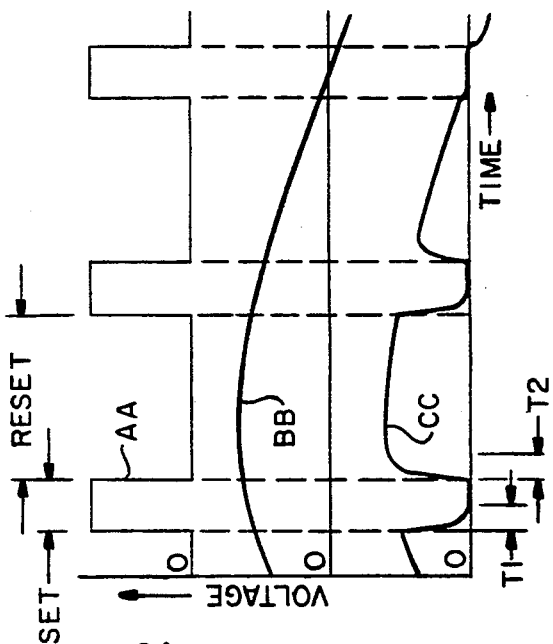
FIG. 2 illustrates waveforms on some nodes in the circuit.

A clock 133 having set phase CK and reset phase $\overline{CK}$ is the controlling function for all of said switches and has driving inputs 134 and 135 for switch 13. FIG. 2 AA shows a sample of it.

When clock is set, a CK pulse turns on both coupling reset switch 14 and output reset switch 17. The output capacitor 18 discharges via switch 17, which resets output voltage of the amplifier 53 to zero. Meanwhile, both coupling capacitors 15 and 16 discharge via both of switches 14 and 17. In this case, only the part of charges induced by input differential mode voltage can be cleared out, yet the other part that is induced by input common mode voltage cannot. At the same time, the switch 13 is turned off, which protects the input voltage from short circuit. This process is called "reset".

When clock is reset, a $\overline{CK}$ pulse turns on the switch 13, while both of switches 14 and 17 are turned off. Accordingly, the capactive divider is charged immediately from said input differential voltage, which makes the output charge voltage on the capacitor 18 of said part P1 and the output voltage of the amplifier 53 as well follow the value of the input voltage proportionally again. This process is called "refollow".

It is interesting that the existence of common mode charges on the capacitors 15 and 16 does not influence the refollow process. FIG. 3 is an equivalent circuit which represents the charge distribution during the reset process, wherein the configuration of capacitors 15 and 16 has been switched from series to parallel, and an assuming common mode voltage $V_{cm}$ and relevant charges still apply on. FIG. 4a is an equivalent circuit which represents the charging situation at the beginning of said refollow process, wherein the configuration of capacitors 15 and 16 has been changed back to series, meanwhile, the differential mode voltage source Vd with an equivalent internal resistor $R_i$ applies upon again. FIG. 4b illustrates equivalent circuit of FIG. 4a, wherein a pair of voltages $V_{cm}$ are induced by common mode charges on capacitors 15 and 16. FIG. 4c illustrates equivalent circuit of FIG. 4b, wherein response of the circuit is the same as the situation of zero common mode voltage. Therefore, it concludes that the response of the circuit in FIG. 1 to input voltage is independent of common mode voltage.

It is obvious that, charging and discharging processes of the capacitive divider may produce error. There are three sections of the process for each clock cycle. The first section that is discharging transient starts from up edge of CK pulse, shown in wave shape AA and CC of FIG. 2. The accuracy of this section is determined by time constant T1 shown in wave shape CC of FIG. 2 produced by coupling capacitor 15, 16 or output capacitor 18 and turn-on resistance $R_{on}$ of the reset switches. For maintaining high accuracy, T1 should be much smaller than pulse width of clock CK. The second section that is charging transient starts from down edge of CK pulse. This accuracy is determined by time constant T2 of charging circuit shown in FIG. 4c, which should be much smaller than time period of reset phase of the clock shown in wave shape AA of FIG. 2. The third section is the reset period of the clock CK. This accuracy is determined by the time constant produced by output capacitor 18 and resistor 19. The time constant should be much larger than the period of this section. Assuming the coupling capacitor 15 and 16 takes 2 picofarads, capacitor 18 takes 5 picofarads, resistor 19 takes 10 G Ohms, turn-on resistance of the reset switches $R_{on}$ takes 1K Ohms, source internal resistance of charging voltage $R_i$ in FIG. 4c takes 20K Ohms or less, the pulse width of CK takes 1 micro-second, repetition period of CK takes 100 micro-seconds. Therefore, all of three parts of accuracy would be good enough.

So far, circuitry analysis of this invention has been made, it concludes a new working arrangement in signal processing called herein "reset-and-refollow", which is other than the well-known manner of "sample-and-hold" or any other type of modulation-demodulation.

The isolation barrier of the circuit in FIG. 1 consists of two parts in parallel. The first part is constituted by coupling capacitors 15 and 16, which can be designed as small as 5 picofarads if the resistor 19 is selected as big as 1 gigaohms. Therefore, a high level isolation barrier can be easily realized by such a small capacitor. The second part is constituted between contacts and driving circuit of the switches 13 and 14. A numerous kinds of the switches can fill the requirement of high level isolation such as optical isolators, semiconductor switches driven by a ringing circuit which can produce single pulse via R.F. transformer coupling and so on.

FIG. 5a shows a simplified scheme wherein a resistor 23 substitutes the protection switch 13 in FIG. 1. However, non-zero turn-on resistance of the switch 14 would bring some additional error.

FIG. 5b shows another simplified scheme wherein a resistor 24 substitutes the coupling reset switch 14 in FIG. 1. However, the bigger resistance of the substitute resistor would make discharging speed slower.

FIG. 6 discloses a practical circuit of the isolation amplifier wherein two output resetting switches 27 and 37 are connected in series to replace the switch 17, and their junction is connected is connected to a reference ground 60. Similarly, two capacitors 28 and 38 are connected in series to replace the output capacitor 18, their junction is also connected to the reference ground 60.

Additionally, it must be pointed out, if set phase of the clock shown in wave shape AA of FIG. 2 is prolonged while its reset phase is shortened until the refollow process changes into a sampling process, therefore, the circuit becomes a new type of sampling circuit with isolation.

While the invention has been described in the format of a preferred embodiment, it will be apparent to those skilled in the art that the present invention may be modified in a number of ways and may assume many embodiments other than that specifically set out and described above. Accordingly, it is intended by the following claims to cover all possible modifications of the invention which fall within the principle of the invention.

What is claimed is:

1. An isolation amplifier with capacitive coupling comprises:
    a) a voltage-to-charge converter means having first and second voltage inputs and first and second charge outputs for converting input differential voltage to output charge; and
    b) a charge detector means having first and second charge inputs connected to the first and second charge outputs of said voltage-to-charge converter and first and second outputs for detecting the charge thereon;

wherein the voltage-to-charge converter means further comprises:
    c) a capacitive divider means for providing a charging path through which input differential voltage charges and for establishing an isolation barrier between said voltage inputs and charge outputs;
    d) a reset switching means for providing the capacitive divider means with a controllable discharging path to clear charges induced by said differential voltage during a short period;
    e) a protective switch means having two contacts and driving inputs being connected in series between said first voltage input and said capacitive divider means by said contacts for providing a short circuit protection to said voltage inputs when said capacitive divider means is discharging, and establishing an isolation barrier between said contacts; and
    f) a clock means having a set phase and a reset phase for driving said reset switching means and said protective switch means respectively;

wherein said capacitive divider means further comprises:
    i) a first coupling capacitor having a first plate connected to said protective switch means for receiving a voltage from said first voltage input, a second plate connected to first charge output of said voltage-to-charge converter means, and an isolation barrier between the plates;
    ii) a second coupling capacitor having a first plate connected to said second voltage input, a second plate connected to the second charge output of said voltage-to-charge converter means, and an isolation barrier between the plates; and
    iii) an output capacitor connected between said two second plates of both said first and second coupling capacitors for storing said output charge proportional to said input differential voltage.

2. The isolation amplifier with capacitive coupling as recited in claim 1 wherein said reset switching means further comprises:
    a) an output reset switch being connected in parallel with said output capacitor for clearing said output charge therefrom and providing a first part of a discharging path to both said coupling capacitors for clearing charges induced by a differential mode voltage from said voltage inputs during said set phase of said clock means; and
    b) a coupling reset switch having two contacts and driving inputs being connected between two first plates of both said coupling capacitors by said contacts for providing a second part of said discharging path to clear the charges induced by differential mode voltage from said voltage inputs during said set phase of said clock means.

3. An isolation amplifier with capacitive coupling comprises:
    a) a voltage-to-charge converter having first and second voltage inputs and first and second charge outputs for converting input differential voltage to output charge and having isolation means providing an isolation barrier between said voltage inputs and said charge outputs; and
    b) a charge detector connected to said charge outputs for detecting said output charge from said charge outputs of said voltage-to-charge converter with isolation means;

wherein said voltage-to-charge converter with isolation means further comprises:
  i) a capacitive divider for providing a charging path through which said input differential voltage charges and for creating said output charge on said charge outputs; wherein the capacitive divider comprises:
    aa) a first coupling capacitor having a first plate connected to a protection switch for receiving a voltage from said first voltage input, and a second plate connected to the first charge output of said voltage-to-charge converter;
    bb) a second coupling capacitor having a first plate connected to said second voltage input, and a second plate connected to the second charge output of said voltage-to-charge converter; and
    cc) an output capacitor connected between said two second plates of both said first and second coupling capacitors for storing said output charge proportional to said input differential voltage;
  ii) said protection switch provides a short circuit protection to a source of said input differential voltage when said capacitive divider is discharging;
  iii) an output reset switch for clearing said output charge on said output capacitor and for providing a first part of a discharging path during a set phase of a clock function to both said coupling capacitors to clear charges produced by said input differential voltage;
  iv) a coupling reset switch for providing a second part of said discharging path during said set phase of said clock function to both said coupling capacitors to clear charges produced by said input differential voltage.

4. An isolation amplifier with capacitive coupling as recited in claim 3 wherein said isolation barrier comprises a first and a second part in series wherein:
  a) the first part is constituted essentially between two plates of each of said coupling capacitors; and
  b) the second part of said isolation barrier is provided between the contacts of said protection switch.

* * * * *

UNITED STATES PATENT AND TRADEMARK OFFICE
CERTIFICATE OF CORRECTION

PATENT NO. : 5,361,037
DATED : November 1, 1994
INVENTOR(S) : Xueming Qiu

It is certified that error appears in the above-indentified patent and that said Letters Patent is hereby corrected as shown below:

On the Title Page, Item [19] and Item [75] should read
—Xueming Qiu— instead of "Xueuing Qui".

Signed and Sealed this

Fourteenth Day of March, 1995

Attest:

BRUCE LEHMAN

Attesting Officer      Commissioner of Patents and Trademarks

UNITED STATES PATENT AND TRADEMARK OFFICE
CERTIFICATE OF CORRECTION

PATENT NO. : 5,361,037

DATED : November 1, 1994

INVENTOR(S) : Xueming Qui

It is certified that error appears in the above-indentified patent and that said Letters Patent is hereby corrected as shown below:

Column 3, line 61, delete --which has two contacts 171 and 172--.
Column 5, line 39, delete second occurrence of --is connected--.

Signed and Sealed this

Twenty-eighth Day of November 1995

Attest:

BRUCE LEHMAN

Attesting Officer     Commissioner of Patents and Trademarks